United States Patent [19]

Drexler

[11] Patent Number: 4,542,442
[45] Date of Patent: Sep. 17, 1985

[54] APPARATUS FOR THE MOUNTING AND WIRING OF PRINTED CIRCUIT BOARDS

[75] Inventor: Rudolph A. Drexler, Bristol, Vt.

[73] Assignee: Simmonds Precision Products, Inc., Tarrytown, N.Y.

[21] Appl. No.: 505,171

[22] Filed: Jun. 17, 1983

[51] Int. Cl.<sup>4</sup> ............................................. H01R 23/68
[52] U.S. Cl. .................................................... 361/413
[58] Field of Search ............... 361/394, 395, 399, 412, 361/413, 415, 419; 211/41; 339/17 M, 17 N

[56] References Cited

U.S. PATENT DOCUMENTS

| | | | |
|---|---|---|---|
| 2,796,559 | 6/1957 | Feucht | 317/100 |
| 3,216,580 | 11/1965 | Fricker, Jr. | 211/41 |
| 3,257,585 | 6/1966 | Ransom et al. | 317/101 |
| 3,265,936 | 8/1966 | Lazar et al. | 361/413 |
| 3,272,933 | 9/1966 | Henderson | 361/413 X |
| 3,539,874 | 11/1970 | Swanson | 317/101 |
| 3,596,139 | 7/1971 | Walsh | 361/415 X |
| 3,596,140 | 7/1971 | Walsh | 317/101 DH |
| 4,161,017 | 7/1979 | Pierce et al. | 361/412 |
| 4,382,517 | 5/1983 | Welsch | 361/415 X |
| 4,384,368 | 5/1983 | Rosenfeldt et al. | 361/415 X |

FOREIGN PATENT DOCUMENTS

| | | |
|---|---|---|
| 1231470 | 5/1971 | United Kingdom . |
| 1248960 | 10/1971 | United Kingdom . |
| 1256332 | 12/1971 | United Kingdom . |
| 1269040 | 3/1972 | United Kingdom . |
| 1296149 | 11/1972 | United Kingdom . |
| 2040590 | 8/1980 | United Kingdom . |
| 2115062 | 9/1983 | United Kingdom . |

Primary Examiner—Vit W. Miska
Attorney, Agent, or Firm—Cushman, Darby & Cushman

[57] ABSTRACT

An apparatus adapted for the mounting and wiring of printed circuit boards includes front and rear supports which together define paired slots into which the circuit boards are receivable and thus transversely mountable relative thereto so as to maintain the boards in a substantially parallel, spaced apart relationship to one another. The boards can be securely locked in the mounted positions by a resilient ring or like structures which seats in a circumferential slot defined in the front and rear supports. An end bell housing is also disclosed whereby various electrical components can be assembled with the circuit boards by virtue of the locking engagement established with the rear support when the bell housing is rotated (e.g. as in a ¼ turn) relative the rear support.

27 Claims, 4 Drawing Figures

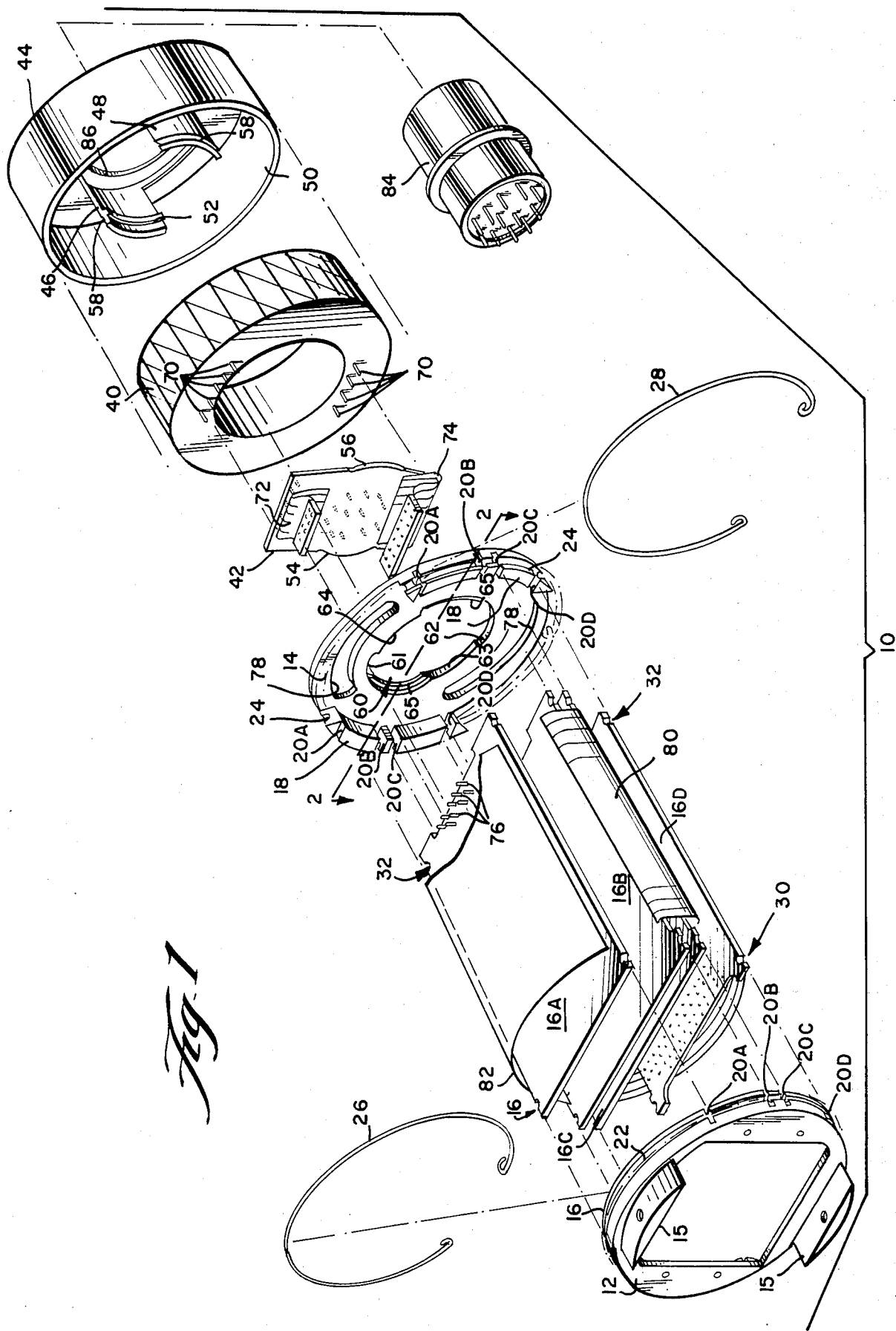

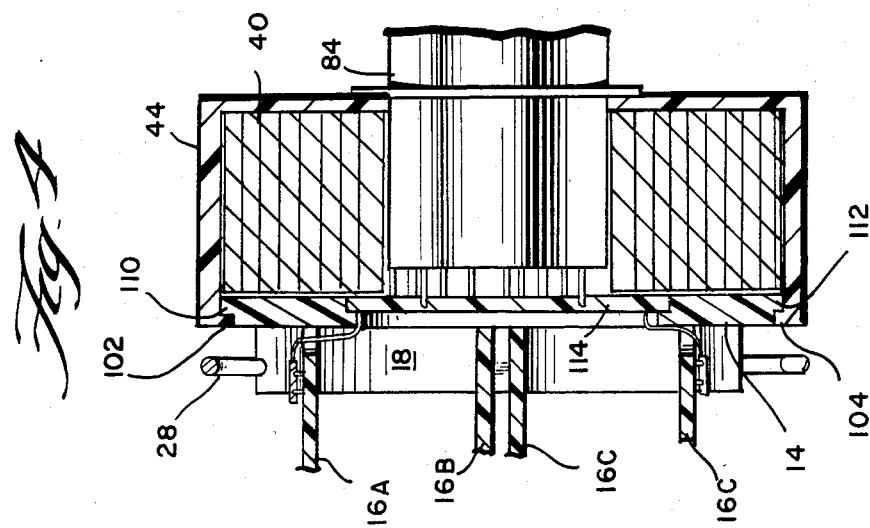
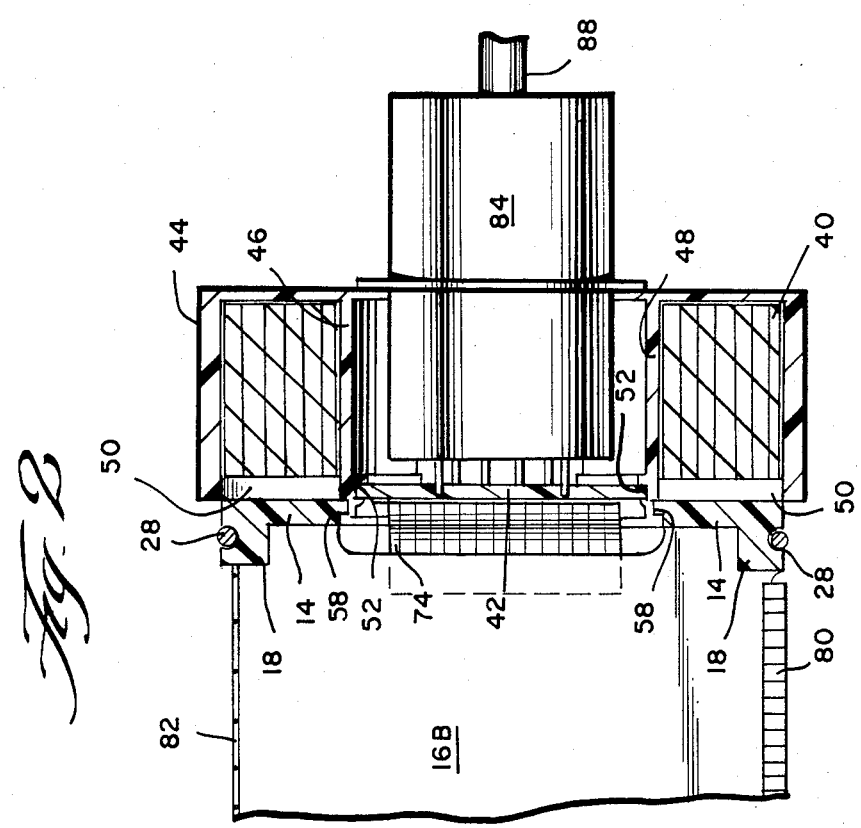

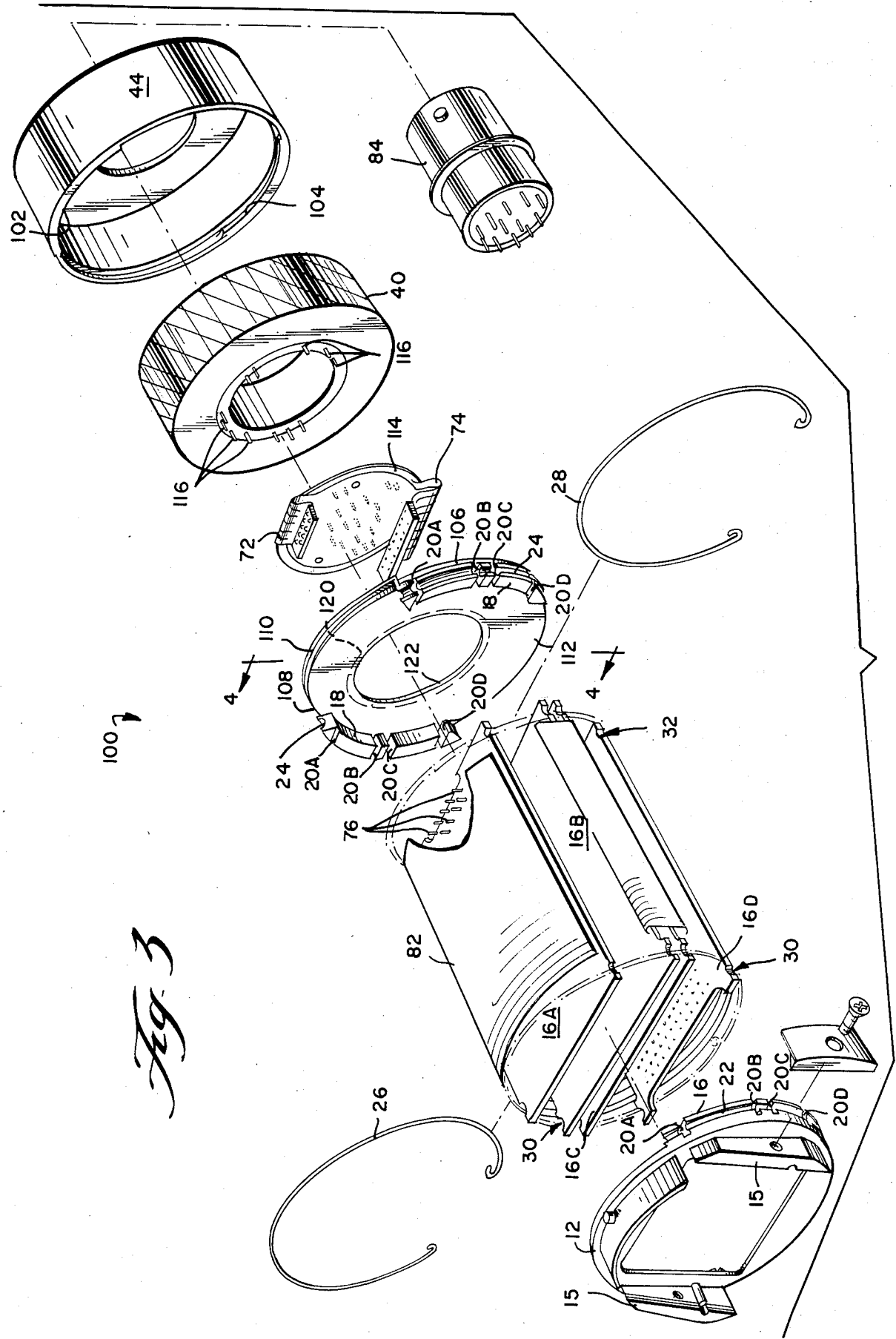

APPARATUS FOR THE MOUNTING AND WIRING OF PRINTED CIRCUIT BOARDS

BACKGROUND AND SUMMARY OF THE PRESENT INVENTION

1. Introduction

In my copending U.S. application Ser. No. 427,277 entitled "Apparatus for the Mounting and Wiring of Printed Circuit Boards", filed Sept. 29, 1982 now U.S. Pat. No. 4,470,101 (the entire disclosure thereof being expressly incorporated hereinto by reference), a novel apparatus was described for the mounting of printed circuit boards in a stacked coaxial relationship relative to one another as conventionally done for components in electrical equipment, e.g. aircraft instrumentation. As fully described in U.S. application Ser. No. 427,277, the invention thereof provides a novel system for the stacked assembly of printed circuit boards which facilitates the eccentric pivotal movement and isolation of selected boards out of the coaxial relationship so as to aid in the manufacture and/or repair thereof.

The present invention is directed to a similar genre of devices in that an apparatus permitting the assembly of printed circuit boards in a stacked relationship is described. More particularly, the present invention is directed to a device which retains printed circuit boards in a stacked relationship transversely between front and rear supports. Although not necessary to the utilization of the present invention, the front support preferably includes an area for the mounting of visual read-out means for instrumentation data, etcetera.

2. Description of the Prior Art

Those in the art to which the present invention pertains have continually sought improved means for contiguously mounting an assembly of printed circuit boards as evidenced, for example, by reference to U.S. Pat. Nos. 4,161,017 to Pierce et al; 3,257,585 to Ransom et al; 3,539,874 to Swanson; 3,596,140 to Walsh and 2,796,559 to Feucht.

Pierce et al disclose a prior art device which permits pivotal movement of printed circuit boards about axes within or parallel to the planes defined by respective circuit boards. Thus, according to the proposal of Pierce et al, if a circuit board located relatively deep in the stack is to be isolated, all circuit boards prior to the desired board must be successively pivoted about their different respective axes to permit unobstructed access thereto. This arrangement is particularly disadvantageous if the circuit board assembly is located in an area of severe spatial limitations. Moreover, since the Pierce et al device contemplates pivotal movement about stacked axes, sufficient slack wire must be provided to permit the extent of pivotal movement necessary for each of the circuit boards in the assembly. It is surmised that upon pivotal movement of the circuit boards, portions of such slack wire may become pinched between the hinge mechanisms or otherwise restrict the intended hinge movements or be exposed to potential damage.

Ransom et al disclose an assemblage of parallel electric or electronic component carrier units. According to Ransom et al, a plurality of component-carrier disc units are attached to a distribution board disk by separate flexible conductive strips radially extending from the distribution board disk, each conductive strip being anchored at one end to the distribution board disk and at the other end to a respective disk.

Swanson discloses that a cradle structure having a plurality of spaced slots can be utilized to hold a stacked arrangement of printed circuit boards. However, as depicted in FIGS. 2 and 3 of the Swanson patent, when predetermined ones of the circuit boards are desired to be removed, they are simply lifted out of the engaging relationship with their associated slot. This form of an arrangement, therefore, utilizes only the interconnecting wiring per se as a means of maintaining the integrity of the assembly when one or more boards are removed from the cradle which could place unnecessary and potentially damaging stresses upon the points of wiring contact with the circuit boards.

Walsh discloses a peripheral contact electronic circuit board assembly. The assembly of Walsh includes a plurality of circuit boards which can be separated from one another by tubular spacers. The circuit boards of Walsh include lugs protruding at regular annular intervals wherein electrical communication can be established between the outside world and the electronic components on the board via contact fingers in contact with conductive rails. Each of the circuit boards and spacers are contained in a cylinder which includes an array of rectilinear T-shaped slots defined in the inner wall parallel to the cylinder axis. Thus, in order to access a circuit board relatively deep in the cylinder, all boards and spacers prior thereto must first be slideably removed from the cylinder.

Feucht discloses that a rigid spacer member can be utilized in combination with a plurality of circuit boards so as to maintain the separation distance therebetween. However, Feucht's main concern is to provide an apparatus permitting the assembly of circuit boards which operates as a heat sink so as to dissipate heat generated by the individual electrical components comprising his assembly.

3. Summary of the Present Invention

As the reader will undoubtedly appreciate from even the most cursory examination of the above prior art proposals, the present invention provides significant advances thereover in both structure and utility in that a circuit board assembly can be provided in accordance with the present invention which facilitates disassembly thereof in the event of repair and/or replacement of any component part yet is of high structural integrity when all component parts are assembled.

Briefly stated, the present invention is directed to the assemblage of printed circuit boards, preferably substantially planar circuit boards, transversely between front and rear supports. The front and rear supports together define substantially aligned front and rear paired mounting slots into which the front and rear portions, respectively, of the printed circuit board are matingly received. Additionally, there is provided according to the present invention a snap ring connector which is seated in a circumferential recess preferably defined by each of the front and rear supports and engageable with indentations formed in circuit boards and mated with the circumferential recess to retain the circuit board in the associated mounting slots to provide overall rigidity to the assembly.

While the present invention is particularly well suited for the transverse mounting of rectangular circuit boards for substantially cylindrically shaped instrumentation, etcetera, the concepts and principles of the present invention could similarly be employed in non-cylindrical instrumentation having circuit boards of other various geometric shapes. Thus, while the accompanying drawings and the detailed discussion thereof below may only describe rectangular printed circuit boards utilized in cylindrical instrumentation, the reader should realize that this merely represents a preferred embodiment in accordance with the present invention and is thus nonlimiting with respect thereto.

It is fairly conventional in the electronic instrumentation art to provide a transformer unit in a contiguous relationship with its associated circuit boards. The present invention also provides a convenient, compact arrangement of a transformer or other electrical components within a bell housing so as to contiguously assemble it with the associated printed circuit boards. The bell housing preferably includes a pair of coaxially disposed gripping fingers which define an annular area with the interior surface of the bell housing into which the transformer is receivable and housed thereby.

To establish electrical communication between the transformer, printed circuit boards and the outside world (e.g. sensors, other instrumentation and the like), an electrical connector is provided which mates with the transformer terminals and preferably defines at least partially arcuate edges which are secured (e.g. by means of solder or the like) to the bell housing. Multiconductor ribbon connectors matable with printed circuit board terminals are also preferably provided. To complete electrical communication between the operative electrical components of the present invention with outside world, the connector is provided with multiple terminals adapted to matingly engage with a typical plug-in connector. The arcuate edges of the electrical connector closely mate with the interior surfaces of the gripping fingers and in the preferred embodiment of the present invention, are fixed thereto by means of solder or the like.

To complete the assembly of the present invention there is preferably provided an opening concentrically defined in the rear support. The opening includes locking recesses so that upon assemblage of the transformer, electrical connector and bell housing, a portion of the exterior surface of the gripping fingers will mate with respective ones of the locking recesses of the opening so that upon manipulation of the bell housing to effect turning movement thereof relative the rear support (e.g. as by effecting ¼ turning movement) locking engagement will be effected. In such a manner, all components of the assembly will be maintained in a structurally rigid manner yet will be capable of being quickly and easily disassembled in the event that repair and/or replacement of any component part becomes necessary.

Other advantages and objects of the present invention will become more clear to the reader after careful consideration is given to the detailed discussion relating to the presently preferred exemplary embodiment thereof which follows.

BRIEF DESCRIPTION OF THE ACCOMPANYING DRAWINGS

Reference will be made hereinafter to the accompanying drawings which depict particularly preferred exemplary embodiments in accordance with the present invention, and wherein:

FIG. 1 is a perspective disassembled view showing the various component parts of the assembly in accordance with one embodiment of the present invention;

FIG. 2 is a partial cross-sectional view taken along line 2—2 in FIG. 1 showing certain of the components in an assembled relationship;

FIG. 3 is a perspective disassembled view showing the various component parts of the assembly in accordance with another embodiment of the present invention; and FIG. 4 is a partial cross-sectional view taken along lines 4—4 in FIG. 3 showing certain of the components in an assembled relationship.

DETAILED DESCRIPTION OF THE PREFERRED EXEMPLARY EMBODIMENTS

An assembly 10 in accordance with one embodiment of the present invention is shown in FIG. 1 wherein the components thereof are depicted in a disassembled relationship for clarity of presentation.

Assembly 10 generally includes front support 12 and rear support 14 between which a plurality of circuit boards 16A, 16B, 16C and 16D are transversely mounted. Although only four representative circuit boards are shown in FIG. 1, the reader should appreciate that any number of boards could be transversely mounted in accordance with the present invention, the upper limit of the number of boards utilized being determined by the spatial limitations of the particular instrument, electrical equipment, etcetera, with which the boards are associated.

Front support 12 can, if desired, be provided with structure (e.g. lobes 15) for mounting additional electronic equipment, visual read-out means, etcetera, thereto. Alternatively, front support 12 could be monolithic in appearance if deemed desirable or necessary.

Interiorly disposed raised portions 16, 18 respectively integral with front and rear supports 12, 14 together define opposing paired slots 20A, 20B, 20C and 20D into which a portion of the front and rear edges of circuit boards 16A, 16B, 16C and 16D are matingly receiveable, respectively. The separation distances between adjacent ones of paired slots 20A–20D will thus define the separation distances between adjacent ones of circuit boards 16A–16D. Moreover, as seen in FIG. 1, such separation distances need not be equivalent (although equivalent separation distances are contemplated) and, indeed, in practice it is surmised that it will be necessary to provide various unequal separation distances between the circuit boards owing to the inherent differences and spatial requirements of the circuit boards themselves. Accordingly, when circuit boards 16A–16D are matingly received in a respective one of paired slots 20A–20D, boards 16A–16D will be transversely oriented with respect to front and rear supports 12, 14 and, moreover, will be disposed substantially parallel with respect to one another.

Portions 16, 18 also define arcuate circumferential recessed areas 22, 24, respectively, which are disposed transversely to slots 20A–20D and which receive a resilient spring clip 26, 28. Boards 16A–16D preferably include indentations 30, 32 or similar structures which register with recessed areas 22, 24, respectively, when the circuit boards are engaged in slots 20A–20C. Thus, due to the registrability of indentations 30, 32 with recessed areas 22, 24, the boards 16A–16D will be captured in a fixed position relative to one another when spring clips 26, 28 are seated in areas 22, 24, respectively. Of course, if any of boards 16A–16D are desired to be removed for testing, repair or the like, the spring clips 26, 28 need only be unseated from areas 22, 24 and the desired board removed from its associated slot.

Another aspect of the present invention is the contiguous assembly of e.g. a transformer 40 and electrical connector 42 with the assembled circuit boards 16A–16D as previously described. To accomplish this further aspect, a bell housing 44 having upstanding resilient fingers 46, 48 or equivalent structures is provided to establish locking unity between transformer 40 and connector 42 on the one hand, and rear support 14 on the other hand in a manner which will now be specifically described.

Transformer 40 is shaped so as to fit within the interior area of housing 44 defined between fingers 46, 48 and interior surface 50. Fingers 46, 48 each define an inner engaging surface 52 which can be, for example, in the form of a recessed arcuate slot for receiving and thus grippingly retaining a portion of the side edges 54, 56 of connector 42. Each of the fingers 46, 48 also defines an outer engaging surface 58 which can similarly be, for example, in the form of a recessed arcuate slot for receiving and thus grippingly engaging a portion of the arcuate aperture in rear support 14.

Rear support 14 defines a central opening 60 having substantially opposing locking recesses 61, 62 defined on the circumferential edge thereof. Lobes 63, 64 alternate with recesses 61, 62 so as to provide structure against which fingers 46, 48 are seated. Thus, upon assembly, fingers 46, 48 are initially positioned to allow passage through recesses 61, 62 so as to permit outer engaging surface 58 to register with a respective one of flanges 63, 64. Thus, upon turning movement (e.g. preferably ¼ of a complete turn) of bell housing 44 relative rear support 14, outer engaging surfaces 58 will slideably engage with flanges 65 so as to rigidly retain housing 44 as a contiguous unit with boards 16A–16D. Disassembly, of housing 44 can, of course, be effected by reverse relative turning movement to that described above.

In such a manner, the end bell housing 44, by virtue of fingers 46, 48 permit transformer 40 and connector 42 to be securely housed thereby while yet effecting structural rigidity between housing 44 and rear support 14. Since fingers 46, 48 are slideably engaged with flanges 65, housing 44 may be separated therefrom to obtain access to the various components in assembly 10 by effecting turning movement therebetween until uncoupling is permitted.

Electrical communication can be established between transformer 40 and connector 42 by pins 70 while connector 42 establishes communication with boards 16A–16D by multi-conductor flexible ribbons 72, 74 connected to appropriate connecting pins on predetermined ones of the circuit boards (for example, ribbon 70 can be connected to board 16A by pins 76 as shown in FIG. 1). Arcuate openings 78 permit ribbon connectors 72, 74 to pass through rear support 14. Communication can also be established between circuit boards utilizing multi-conductor ribbons 80, 82 as shown in FIG. 1 in a manner known to those in this art. Other means of effecting electrical communication between electronic components can also be utilized and as these other means are also believed to be known to those in this art, a detailed discussion thereof appears unnecessary. Finally, electrical communication between assembly 10 and the outside world can be established utilizing a conventional multi-pin plug-in connector 84 adapted to being seated or fixed in aperture 86 of housing 44, the pins of which establish electrical contact with connector 42. A cable (shown at 88 in FIG. 2) can be provided with connector 84 in a conventional fashion.

A particularly preferred embodiment of the assembly 100 in accordance with the present invention is depicted in accompanying FIGS. 3 and 4. Generally, the embodiment of assembly 100 is similar to the embodiment of assembly 10 described above in that circuit boards 16A–16D are transversely mounted between front and rear supports 12, 14, respectively. Accordingly, like reference numerals in accompanying FIGS. 3 and 4 denote like structural elements with regard to the embodiment depicted in FIGS. 1 and 2, and thus the reader's attention is directed to the discussion above for the functional characteristics thereof.

The primary distinction between the assembly 100 shown in accompanying FIGS. 3–4 and assembly 10 shown in accompanying FIGS. 1–2 relates to the assemblage of bell housing 44 (and thus transformer 40) with rear support 14 so as to provide a substantially rigid, contiguous unit. Thus, whereas the assembly of the FIGS. 1–2 embodiment accomplishes this rigid interconnection by virtue of outer engaging surfaces defined by gripping fingers 46, 48 being engaged with interior circumferential flanges 65 upon relative turning movement between housing 44 and rear support 14, the rigid interconnection of the FIGS. 3–4 embodiment is effected by virtue of locking flanges 102, 104 provided on the leading edge of bell housing 44 cooperating with locking recesses 106, 108 defined on the exterior circumferential edge of rear support 14. Thus, end bell housing 44 is initially positioned relative rear support 14 so that flanges 102, 104 register with recesses 106, 108, respectively, and rigid locking interengagement will be effected by virtue of flanges 102, 104 being slideably turned into locking engagement with flanges 110, 112 of rear support 14.

Prior to assembly of end bell housing 44 onto rear support 14, transformer 40 is placed into the interior space defined by the former. Connector 114 is positioned onto pins 116 so that electrical communication can be established in a manner similar to that described above with respect to connector 42 of the FIGS. 1–2 embodiment. In accordance with the FIGS. 3–4 embodiment, connector 114 is held securely in place not only by virtue of engagement with pins 116, but also by virtue of recessed area 120 defined around the circumferential edge of opening 122 on the rear face of rear support 14. Thus, connector 114 seats in area 120 so as to be held therein when bell housing 44 is lockably interengaged with rear support 14.

While terms such as circular, arcuate, cylindrical and the like have been utilized above to describe the geometry of the presently preferred embodiment of the present invention, other geometric forms are well within the contemplation of the present invention. Thus, for example, fingers 46, 48, bell housing 44, edge 60, recessed areas 22, 24 and front and rear supports 12, 14 could be any other geometric form (e.g. square, rectangular, etcetera) as required.

Furthermore, it should be noted that although circuit boards 16A–16D have been depicted as being transversely mounted between front and rear supports 12, 14 in a horizontal fashion, vertical or other angular dispositions of boards 16A–16D transversely between front and rear supports 12, 14 is also contemplated. Thus, any angular relationship of the boards 16A–16D with respect to horizontal can be achieved in accordance with the present invention as long as they are mounted substantially transverse to the front and rear supports 12, 14.

While the present invention has been herein described in what is presently conceived as being the most preferred embodiment, those in the art will recognize that many modifications and variations may be made while still retaining many of the novel features and advantages of this invention. Accordingly, all such modifications and variations are intended to be within the scope of the following claims.

What is claimed is:

1. An apparatus adapted for mounting a plurality of electrical circuit boards of the type including indentations associated therewith, said apparatus comprising:
   support means for supporting the circuit boards;
   said support means including front and rear support members;
   said front and rear support members including a plurality of paired slots, each pair for receiving respective portions of a circuit board therein and for thereby mounting plural circuit boards, when received in respectively corresponding ones of said paired slots, substantially transversely to said front and rear support members and for separating adjacent ones of said circuit boards by a predetermined dimension when received in said slots; and
   removeable locking means engageable with said front and rear support members for removeably locking the circuit boards to said front and rear support members and for effecting substantially rigid interconnection therebetween, said locking means including (a) means defining recessed areas in said front and rear support members such that said indentations associated with the circuit boards are registrable with said recessed areas when the circuit boards are received in said slots, and (b) resilient means seatable in said recessed areas for engaging the circuit board indentations and thus locking the circuit boards in said slots.

2. An apparatus as in claim 1 wherein said means defining recessed areas in said front and rear support members are located in a plane substantially transverse to said slots.

3. An apparatus as in claim 1 or 2 wherein said rear support member includes an interior edge and wherein said apparatus further comprises housing means for housing an electrical component and interconnecting means engageable with said interior edge for removeably interconnecting said housing means to said rear support member.

4. An apparatus as in claim 3 wherein said interconnecting means includes a pair of gripping fingers defining first gripping surfaces engageable with said interior edge upon effecting relative turning movement between said housing means and said interior edge.

5. An apparatus as in claim 3 further comprising electrical connection means for establishing electrical communication between said electrical component and the circuit boards, a portion of said electrical connection means defining opposing exterior edges engageable with said interconnecting means for permitting contiguous assembly of said housing means, electrical component and said electrical connection means with said rear support member.

6. An apparatus as in claim 5 wherein said interconnecting means includes a pair of gripping fingers defining first gripping surfaces on the exterior of said fingers engageable with said interior edge upon effecting relative turning movement between said housing means and said interior edge and defining second gripping surfaces on the interior of said fingers engageable with said exterior edges of said electrical connection means.

7. Apparatus comprising:
   a plurality of electrical circuit boards;
   a pair of substantially coaxial, parallel, spaced apart arcuate members for transversely mounting the sides of said circuit boards between said arcuate members in mated pairs of transverse slots formed in opposingly directed faces of the arcuate members, wherein said paired slots are parallel and spaced apart from one another to thereby separate adjacent ones of said circuit boards in respective parallel mounting planes; and
   locking means removeably engaged with said arcuate members for removeably locking said circuit boards to said arcuate members and for effecting substantially rigid interconnection therebetween.

8. Apparatus as in claim 7 wherein said locking means comprises:
   circumferential recessed areas in each of said arcuate members in a plane substantially transverse to said mounting planes,
   indications associated with the ends of said circuit boards and registered with said recessed areas when said circuit boards are received in said slots, and
   resilient means seatable in said recessed areas for engaging said indentations and thus locking said circuit boards in said slots.

9. Apparatus as in claim 7 or 8 wherein one of said arcuate members includes means defining a locking edge and wherein said apparatus further comprises:
   housing means for housing an electrical component therein, and
   interconnecting means removeably engaged with said locking edge for removeably interconnecting said housing means thereto.

10. An assembly as in claim 11 wherein said interconnecting means includes a pair of gripping fingers including means defining gripping surfaces removeably engaged with said locking edge.

11. An assembly comprising:
    a front support member including means defining a first set of slots spaced apart by predetermined dimensions along a first direction;
    a rear support member separated from and coaxially aligned with said front support member and including means defining a second set of slots also spaced apart by said predetermined dimensions along a second direction parallel to said first direction,
    said second set of slots being paired with corresponding ones of said first set of slots to establish a plurality of substantially parallel mounting planes disposed transversely between said front and rear support members, adjacent ones of said mounting planes being thereby separated by said predetermined dimensions;
    a plurality of electrical boards each having opposing ends respectively mated with a predetermined one of said slot pairs so as to be disposed in the respective mounting planes established therebetween, said circuit boards being substantially parallel to one another and separated from adjacent ones of said circuit boards by said predetermined dimensions, and including indentations formed in said opposing ends; and
    first and second securing means engaged with said front support and one end of said circuit boards and said rear support and the other end of said circuit boards, respectively, for removeably securing said circuit boards to said front and rear support members and for effecting substantial rigid unity between said front and rear supports by virtue of the structural interconnection therebetween of said circuit boards;

each said front and rear supports defining recessed areas, said indentations in said opposing ends of said circuit boards being registered with said recessed areas when said circuit boards are received in said slot pairs; and wherein said securing means includes resilient means seatable in said recessed areas for engaging said indentations and thus locking said circuit boards in said slot pairs.

12. An assembly as in claim 11, wherein said front and rear supports define front and rear support planes substantially parallel to one another, said mounting planes being substantially transverse to said front and rear support planes.

13. An assembly as in claim 11 wherein said recessed areas are located in a plane substantially transverse to said mounting planes.

14. An assembly as in claim 11 or 13 wherein said rear support member includes an interior edge and wherein said assembly further comprises housing means for housing an electrical component therein and interconnecting means removeably engaged with said interior edge for removeably connecting said housing means thereto.

15. An assembly as in claim 14 wherein said interconnecting means includes a pair of upstanding gripping fingers including gripping surfaces removeably engaged with said interior edge.

16. An assembly as in claim 11 or 13 wherein said rear support member includes means defining a pair of locking recesses on the circumferential edge of said rear support member and wherein said assembly further comprises housing means for housing an electrical component therein, said housing means including means defining a pair of locking flanges engageable with said pair of locking recesses for removeably interconnecting said housing means and said rear support member when said housing means is rotated relative said rear support member.

17. Apparatus for mounting rectangular printed circuit boards in a cylindrical space, said apparatus comprising:

a front mounting plate having a circumferential arcuate groove and also having on one side thereof plural spaced apart transverse slots extending through the arcuate groove;

a back mounting plate having a circumferential arcuate groove and also having on one side thereof plural spaced apart transverse slots extending through the arcuate groove;

plural rectangular printed circuit boards each having a pair of opposed edge indentations at its opposite ends, the end of said boards and said edge indentations being dimensioned to fit within corresponding pairs of said transverse slots in the front and back mounting plates with the edge indentations in registry with the respective arcuate grooves of said front and back mounting plates;

a front arcuate spring clip dimensioned to resiliently engage the arcuate groove in said front mounting plate and the edge indentations in registry therewith; and a back arcuate spring clip dimensioned to resiliently engage the arcuate groove in said back mounting plate and the edge indentations in registry therewith.

18. Apparatus as in claim 17 further comprising:

rear edge connector means at least partially disposed through an aperture in said rear mounting plate and electrically connected to at least one of said printed circuit boards.

19. Apparatus as in claim 18 further comprising:

a rear housing with internally projecting gripping fingers defining an annular space therein;

an annular shaped electrical component housed within said annular space such that said gripping fingers extend therebeyond;

the outwardly directed surface of said extended gripping fingers being physically engaged with an interior edge of the aperture in said rear mounting plate.

20. Apparatus as in claim 19 wherein the inwardly directed surface of said extended gripping fingers are physically engaged with an exterior edge of the rear edge connector means.

21. Apparatus as in claim 19 or 20 wherein said annular shaped electrical component is electrically connected to said rear edge connector means.

22. Apparatus as in claim 18, 19, or 20 wherein said rear edge connector means further comprises electrical connections at the center portion thereof adapted to mate with a removable electrical connector plug.

23. An assembly comprising:

a front support member including means defining a first set of slots spaced apart by predetermined dimensions along a first direction;

a rear support member separated from and coaxially aligned with said front support member and including means defining a second set of slots also spaced apart by said predetermined dimensions along a second direction parallel to said first direction, said second set of slots being paired with corresponding ones of said first set of slots to establish a plurality of substantially parallel mounting planes disposed transversely between said front and rear support members, adjacent ones of said mounting planes being thereby separated by said predetermined dimensions;

a plurality of electrical circuit boards each having opposing ends respectively mated with a predetermined one of said slot pairs so as to be disposed in the respective mounting planes established therebetween, said circuit boards being substantially parallel to one another and separated from adjacent ones of said circuit boards by said predetermined dimensions; and first and second securing means engaged with said front support and one end of said circuit boards and said rear support and the other end of said circuit boards, respectively, for removeably securing said circuit boards to said front and rear support members and for effecting substantial rigid unity between said front and rear supports by virtue of the structural interconnection therebetween of said circuit boards, wherein said support member includes an interior edge and said assembly further comprises housing means for housing an electrical component therein and interconnecting means removeably engaged with said interior edge for removeably connecting said housing means thereto, said interconnecting means including a pair of upstanding gripping fingers defining gripping surfaces removeably engaged with said interior edge.

24. An assembly comprising:

a front support member including means defining a first set of slots spaced apart by predetermined dimensions along a first direction;

a rear support member separated from and coaxially aligned with said front support member and including means defining a second set of slots also spaced apart by said predetermined dimensions along a second direction parallel to said first direction, said second set of slots being paired with corresponding ones of said first set of slots to establish a plurality of substantially parallel mounting planes disposed transversely between said front and rear support members, adjacent ones of said mounting planes being thereby separated by said predetermined dimensions;

a plurality of electrical circuit boards each having opposing ends respectively mated with a predetermined one of said slot pairs so as to be disposed in the respective mounting planes established therebetween, said circuit boards being substantially parallel to one another and separated from adjacent ones of said circuit boards by said predetermined dimensions; and first and second securing means engaged with said front support and one end of said circuit boards and said rear support and the other end of said circuit boards, respectively, for removeably securing said circuit boards to said front and rear support members and for effecting substantial rigid unity between said front and rear supports by virtue of the structural interconnection therebetween of said circuit boards, wherein said rear support member includes means defining a pair of locking recesses on the circumferential edge of said rear support member, and wherein said assembly further comprises housing means for housing an electrical component therein, said housing means including means defining a pair of locking flanges engageable with said pair of locking recesses for removeably interconnecting said housing means and said rear support member when said housing means is rotated relative to said rear support member.

25. An assembly as in claim 23 or 24 wherein said front and rear supports define front and rear support planes substantially parallel to one another, said mounting planes being substantially transverse to said front and rear support planes.

26. Apparatus comprising:

a plurality of electrical circuit boards;

a pair of substantially coaxial, parallel, spaced apart members for transversely mounting the sides of said circuit boards between said members in mated pairs of transverse slots formed in opposingly directed faces of the members, at least one of said members including means defining a locking edge;

housing means for housing an electrical component therein, and interconnecting means removeably engaged with said locking edge for removeably interconnecting said housing means thereto; wherein said interconnecting means includes a pair of gripping fingers including means defining gripping surfaces removeably engaged with said locking edge.

27. Apparatus comprising:

a plurality of electrical circuit boards;

a pair of substantially coaxial, parallel, spaced apart members for transversely mounting the sides of said circuit boards between said members in mated pairs of transverse slots formed in opposingly directed faces of the members, at least one of said members including means defining a pair of locking recesses on the circumferential edge thereof; and housing means for housing an electrical component therein, said housing means including means defining a pair of locking flanges engageable with said pair of locking recesses for removeably interconnecting said housing means and said at least one member when said housing means is rotated relative to said at least one member.

* * * * *